United States Patent
Stessen et al.

[11] Patent Number: 6,100,661
[45] Date of Patent: Aug. 8, 2000

[54] TIME-DISCRETE PHASE-LOCKED LOOP

[75] Inventors: Jeroen H. C. J. Stessen; Age J. Van Dalfsen, both of Eindhoven, Netherlands

[73] Assignee: U.S. Philips Corporation, New York, N.Y.

[21] Appl. No.: 09/216,258

[22] Filed: Dec. 18, 1998

[30] Foreign Application Priority Data

Dec. 22, 1997 [EP] European Pat. Off. .............. 97204066

[51] Int. Cl.[7] .................................................. G05B 1/02
[52] U.S. Cl. ...................... 318/606; 318/608; 388/911; 358/158; 358/148
[58] Field of Search .................... 318/606, 608; 388/911; 375/110, 87; 358/158, 148

[56] References Cited

U.S. PATENT DOCUMENTS

| | | | |
|---|---|---|---|
| 4,606,052 | 8/1986 | Hirzel et al. | 375/87 |
| 4,608,702 | 8/1986 | Hirzel et al. | 375/110 |
| 5,181,115 | 1/1993 | Flamm et al. | 358/158 |

*Primary Examiner*—Karen Masih
*Attorney, Agent, or Firm*—Edward W. Goodman

[57] ABSTRACT

A time-discrete phase-locked loop includes a discrete time oscillator (DTO) which supplies a periodical oscillator signal (OS) representing oscillator values (OV) at corresponding clock instants (TC) of a clock signal (CLK). A position-determining circuit (P) generates a time-discrete synchronization instant (SI) representing a position of an analog synchronizing pulse (SP) of a video signal with sub-clock period accuracy. A phase detector (PD) determines a phase error (PE) between the discrete time oscillator signal (OS) and the synchronization instant (SI) by using the synchronization instant (SI), a value (OV1) of the discrete time oscillator signal (OS) at a clock instant (TC1) related to the synchronization instant (SI), and the slope of the oscillator signal (OS). A period of the oscillator signal (OS) depends on the phase error (PE). By using the slope of the oscillator signal (OS), the phase error (PE) is independent of this slope.

9 Claims, 5 Drawing Sheets

TIME-DISCRETE PHASE-LOCKED LOOP

FIELD OF THE INVENTION

The invention relates to a time-discrete phase-locked loop for generating a periodical oscillator signal being locked to synchronization pulses in a video signal and comprising a clock oscillator for determining clock instants; positiondetermining means for receiving said synchronizing pulses to supply time-discrete synchronization instants with sub-clock accuracy; a discrete time oscillator comprising an integrator for summing an increment value at the clock instants to supply the oscillator signal having a period which is dependent on a phase error between said synchronization instants and said oscillator signal; a sampler for sampling said oscillator signal at a clock instant which is related to said synchronization instant to obtain a sampling value; and a phase detector for estimating the phase error dependent on the sampling value and said synchronization instant. The invention also relates to a method of locking a discrete time oscillator signal to a synchronization instant, the method comprising the steps of generating clock instants; determining time-discrete synchronization instants representing instants of occurrence of said synchronizing pulses with sub-clock period accuracy; integrating an increment value at the clock instants to supply said oscillator signal having a period which is dependent on a phase error between said synchronization instants and said oscillator signal; sampling said oscillator signal at a clock instant which is related to one of the synchronization instants to obtain a sampling value; and estimating the phase error dependent on the sampling value and said one of the synchronization instants. The invention further relates to a display apparatus which comprises such a time discrete phase-locked loop.

DESCRIPTION OF THE RELATED ART

U.S. Pat. No. 5,181,115 discloses a time-discrete phase-locked loop (further referred to as PLL). The PLL has a periodically overflowing digital oscillator implemented as a modulo adder adding an incremental value every clock period. The PLL further comprises a processor device. The processor device adjusts the period of the digital oscillator to a nominal period, determined from periodically occurring synchronizing pulses, by comparing the actual phase of the digital oscillator with a set phase at the control clock rate of the periodic synchronizing pulses. First, an instantaneous value of the digital oscillator is stored, triggered by the synchronizing pulse to determine a (coarse) phase difference between a reference value and the digital oscillator value occurring at a clock instant. Secondly, the processor device generates skew data from the input synchronizing pulses to add information about the position of the synchronizing pulses with sub-clock accuracy to the coarse phase difference so as to obtain a combined phase difference. This combined phase difference is filtered in a loop filter. The filtered phase difference is added to a frequency reference so as to obtain a control signal for controlling an increment value of the digital oscillator.

It is a drawback of the prior-art PLL that the combined phase error is correct only at one fixed line frequency, thereby disturbing the phase lock between the digital oscillator and the synchronizing pulses.

SUMMARY OF THE INVENTION

It is an object of the invention to provide a time-discrete PLL with an improved phase lock between the digital oscillator and the synchronizing pulses.

To this end, a first aspect of the invention provides a time-discrete PLL as described in the opening paragraph, in which the phase detector estimates the phase error dependent on said increment value. A second aspect of the invention provides a method of locking a discrete time oscillator signal to a synchronization instant as described in the opening paragraph, in which the estimating step includes estimating the phase error dependent on said increment value. A third aspect of the invention provides a display apparatus comprising a time discrete PLL.

A discrete time oscillator integrates an increment value at clock instants of a clock signal generated by a free running clock oscillator to supply a periodical oscillator signal which represents discrete oscillator values at the clock instants. The oscillator signal may be a periodical digital staircase.

A synchronization position detector determines an instant of occurrence of an analog synchronizing pulse of a videosignal (further referred to as synchronization instant) with sub-clock period accuracy. As an example, the position of the analog synchronizing signal is determined by first converting the analog synchronizing signal to digital synchronization values with an A/D converter which is clocked by the clock signal. Secondly, the position of an edge of the analog synchronizing signal (for example, the instant at which the edge crosses a mid-level value) is determined from the digital synchronization values by interpolation or over-sampling, as known from the prior art.

A sampler samples a value of the discrete time oscillator at a clock instant related to the synchronization instant. For example, the value of the discrete time oscillator may be sampled at the first clock pulse after the edge crosses the mid-level value. It is also possible to sample the value of the discrete oscillator at the first clock pulse after the start of the edge is detected.

A phase detector determines a phase error between the discrete time oscillator signal and the synchronization instant by using the sampled value of the discrete time oscillator, the synchronization instant, and the increment value of the discrete time oscillator. In this way, the value of the discrete time oscillator at the synchronization instant is determined by using the slope of the oscillator signal. Consequently, the estimated phase error is correct, even if the slope of the oscillator signal varies. The period of the oscillator signal depends on the phase error. In a stable situation, the phase error is zero. As in the prior art, the estimated phase error is independent of the slope of the synchronizing pulse.

In a variant the sub-clock position of the synchronization instant is indicated by a factor or a fraction indicating the offset of the synchronization instant with respect to the clock instant at which the sampled discrete time oscillator value occurs.

It is possible to first determine a coarse phase error by comparing the sampled discrete time oscillator value with the reference value and subsequently applying a correction to this coarse phase error with a multiplication of the increment value and the factor.

It is possible to directly interpolate the discrete time oscillator value occurring at the synchronization instant by correcting the sampling value of the discrete time oscillator with the multiplication of the factor and the increment value. Subsequently, the phase error is determined by comparing the interpolated discrete time oscillator value with the reference value.

In both cases, the phase error between the discrete time oscillator and the synchronization instant is determined by using a value of the discrete time oscillator at a clock instant and by using the slope of the discrete time oscillator together with the synchronization information. So, in both cases, in fact, the actual phase error is determined between the reference value and the actual value of the discrete time oscillator at the synchronization instant.

In conclusion, the invention estimates the phase error dependent on the slope of the discrete time oscillator, whereas U.S. Pat. No. 5,181,115 corrects a coarse phase error with a fixed amount. The fixed amount only depends on the position of the synchronization instant with respect to the clock instants. This causes an incorrect estimation of the phase error at the synchronization instant if a slope of the discrete time oscillator varies or is selected to have different values. Consequently, the estimated discrete time oscillator value has the correct value only at one predetermined repetition frequency of the synchronization instants. Consequently, the prior-art PLL is not suitable for processing video signals which have different repetition frequencies of the synchronization instants. Moreover, during small changes of the repetition frequency of the synchronization instants, the small errors in the estimated value of the discrete time oscillator cause jitter.

In an embodiment of the invention the phase error controls the period of the discrete time oscillator signal by adapting the increment value. In this way, as in the prior art, the slope of the discrete time oscillator is controlled by the phase error to vary with the repetition frequency of the synchronization instants.

In another embodiment of the invention the phase error controls the flyback height of the discrete time oscillator instead of the slope. Consequently, the increment value which is integrated every clock period is constant. This has the advantage that the discrete time oscillator is simple because the increment value can be selected to be a power of two.

The time-discrete phase-locked loop, according to the invention may be used to lock the discrete time oscillator to line-synchronizing pulses of a video signal to generate a line-locked reference signal to be used in a line deflection of a video display apparatus (such a phase-locked loop is generally known as phi-one loop). The time-discrete phase-locked loop, according to the invention, may also be used to receive the line-locked reference signal to generate line drive pulses for a line output stage (such a phase-locked loop is generally known as phi-two loop). In the second case, the synchronization instants are derived from the line deflection, for example, line flyback pulses may be used.

The time-discrete phase-locked loop, according to the invention may also be used to generate a control signal for a sample rate converter. In the case of an input sample rate converter which receives time-asynchronous sampled discrete video samples and supplies orthogonal sampled video samples, the time-discrete phase-locked loop generates a line-locked signal from the line-synchronizing pulses of the video signal. In the case of an output sample rate converter which receives orthogonal sampled video samples and supplies asynchronous sampled video samples, the time-discrete phase-locked loop receives the synchronization instants related to the line deflection to generate a control signal for the output sample rate converter.

These and other aspects of the invention will be apparent from and elucidated with reference to the accompanying drawings.

DESCRIPTION OF THE PREFERRED EMBODIMENTS

Figure 1:
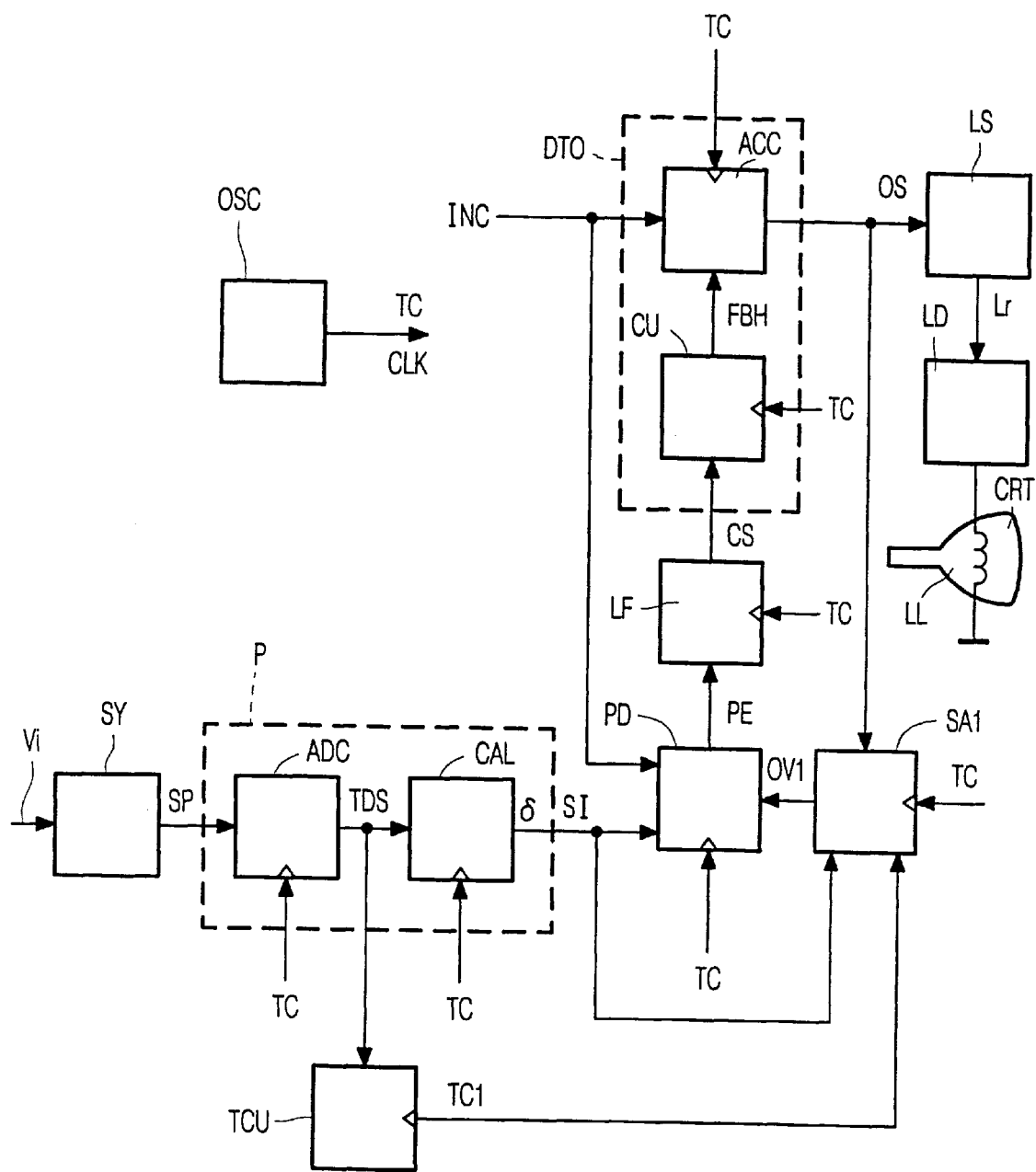
FIG. 1 shows a block diagram of a display apparatus with a first embodiment of the time-discrete phase-locked loop according to the invention.

FIG. 1 shows a block diagram of a time-discrete phase-locked loop according to the invention.

A clock oscillator OSC generates a clock signal CLK determining clock instants TC. The clock oscillator OSC may be a crystal oscillator supplying a very stable clock signal CLK which is asynchronous with respect to periodically occurring synchronizing pulses SP. A synchronization separator SY separates the synchronizing pulses SP from an analog video signal Vi or the synchronisation pulses SP may belong to a time-discrete video signal. In the case of an analog video signal Vi, an A/D converter ADC receives the clock signal CLK and the analog synchronizing pulses SP to supply a time-discrete synchronizing signal TDS to a calculation unit CAL. The A/D converter ADC and the calculation unit CAL are part of a synchronization position detector P.

The synchronization position detector P supplies synchronization instants SI representing a position of a synchronizing pulse SP with sub-clock period accuracy. The position of a synchronizing pulse SP may be defined as a synchronization instant SI at which an edge of the synchronizing pulse SP crosses a reference value (for example, a mid-level value). As known from U.S. Pat. No. 5,181,115, the synchronization instant SI may be determined by interpolating time-discrete synchronization values of the time-discrete synchronizing signal TDS.

A discrete time oscillator DTO comprises an integrator ACC and a control unit CU. The integrator ACC may be a modulo adder as known from the prior art for supplying a periodical oscillator signal OS which represents discrete time oscillator values OV at clock instants TC of the clock signal CLK. In this case, the oscillator signal OS is a digital staircase obtained by summing an increment value INC during each clock period. The control unit CU supplies a flyback value FBH to the integrator ACC to control a start value of the oscillator signal OS in a succeeding period dependent on a control signal CS. The increment value INC has a predetermined value.

A sampler SA1 samples a value OV1 of the oscillator signal OS at a clock instant TC1 related to the synchronization instant SI. A timing control unit TCU receives the time-discrete synchronizing signal TDS to supply the clock instant TC1. The sampler SA1 may be a D-type flip-flop receiving the oscillator signal OS at a data input, and the clock instants as an edge at a respective load enable input. When a microprocessor is used, the value OV1 may be stored in a memory.

The phase detector PD estimates a phase error PE between the oscillator signal OS and the synchronization instant SI by using the sampled value OV1, the synchronization instant SI, and the increment value INC. The phase detector PD calculates the phase error PE as $$PE = REF - OV1 - \delta * INC$$

wherein
REF is a reference value,
OV1 is the sampling value,
INC is the increment value, and
$\delta$ is a factor which is measure for the position of the synchronization instant SI within a clock period. If the time discrete synchronization instant SI is represented by a digital word, the factor $\delta$ may be represented by the least significant bits which determine a fraction between two successive clock instants TC.

It is essential for the invention that the phase error is estimated by using the increment value INC, such that the slope of the oscillator signal OS is used. It is also possible to subtract the reference value REF from the sampled value OV1 and to add the multiplication of the factor $\delta$ by the incremental value INC. The incremental value INC may also be determined as a difference between the sampling value OV1 and a further sampling value OV2 of the oscillator signal OS sampled at a further clock instant TC2. For example, the first value OV1 may be sampled at the first clock pulse CLK after the synchronization instant SI. The synchronization instant SI is the instant at which an edge of a synchronizing pulse SP crosses a reference level value. The reference level may be selected to be the midvalue of the synchronizing pulses SP. In this case, the second value OV2 may be the sampled value at a clock instant immediately preceding the mid-level value. The selection of the sample clock instants TC1 and TC2 is not an important issue for the invention. If these sample clock instants TC1 and TC2 are also used to interpolate the synchronization instant SI, it is important that both clock instants TC1, TC2 are selected to occur during the same edge of a synchronizing pulse SP. It is also possible to obtain the sample clock instants TC1 and TC2 by first comparing two successive values of the time-discrete synchronizing signal TDS to detect a start of an edge of the synchronizing pulse SP. A start is detected if the values differ by more than a predetermined amount, and the sign of the slope detected fits the sign of the slope of the edge concerned. The clock instant at which the last of the two successive values occurs is the first clock instant TC1. The second clock instant TC2 may be selected to be the clock instant immediately following the first clock instant TC1. The second clock instant TC2 may also be the first clock instant after the synchronization instant SI. The second clock instant TC2 may also be the last clock instant occurring during the edge.

An optional time-discrete loop filter LF filters the phase error PE to supply the control signal CS to the discrete time oscillator DTO.

The discrete time oscillator DTO supplies the oscillator signal OS as a time base signal to a line synchronization circuit LS which supplies line reference pulses LR to a line deflection circuit LD. The line deflection circuit LD supplies a line deflection current to a line deflection coil LL arranged arround a cathode ray tube CRT.

The position of the time base signal with respect to the synchronization pulses SP is adjustable by controlling the reference value REF. In this way, a horizontal shift of a picture displayed on the cathode ray tube CRT can be obtained.

Embodiments of the phase detector PD are described with reference to FIGS. 2 and 3, and an embodiment of the loop filter LF is described with reference to FIG. 8.

The operation of the time-discrete phase-locked loop according to the invention will become clear in the description of FIGS. 3 to 8.

Figure 2:
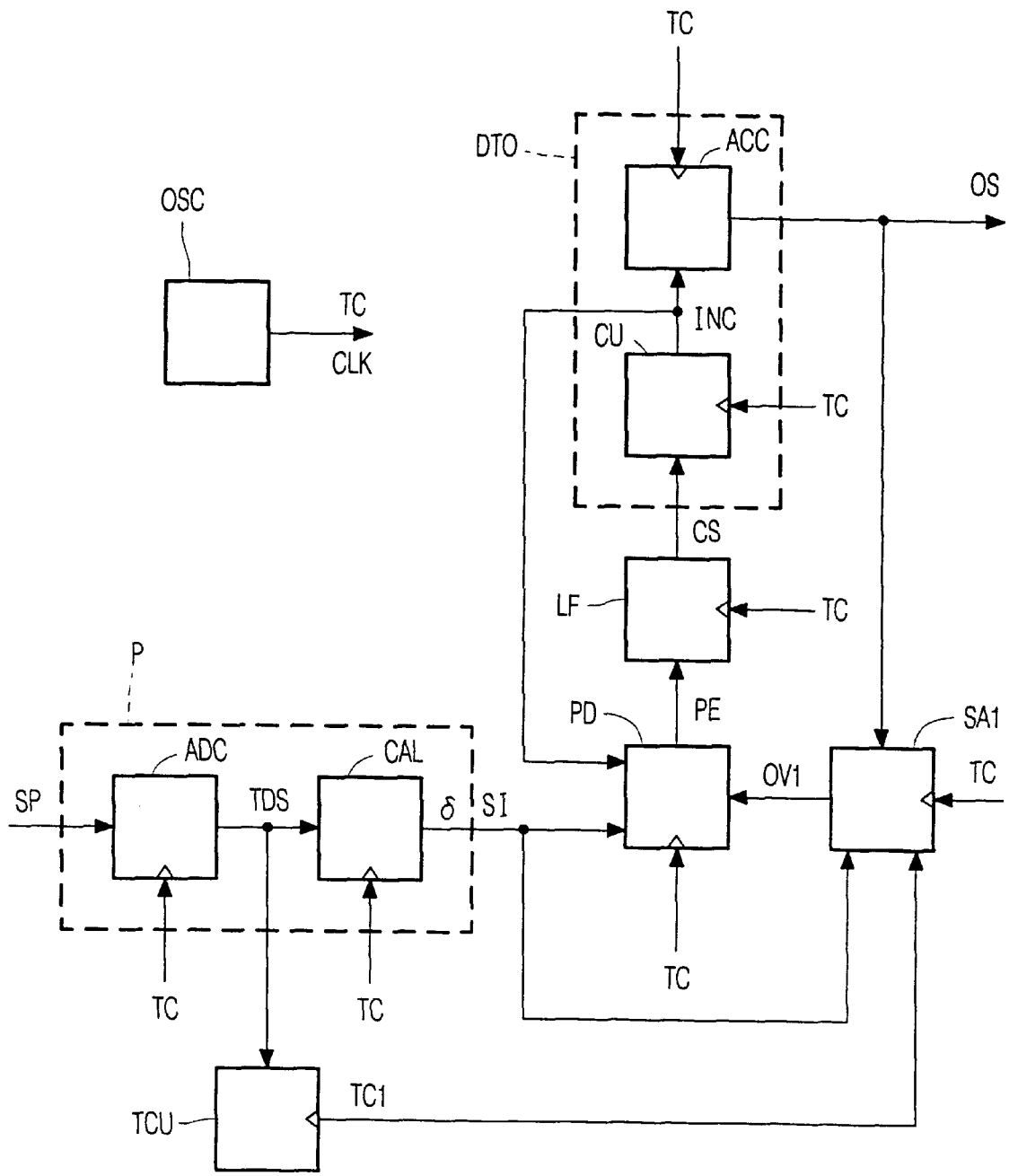
FIG. 2 shows a block diagram of another embodiment of the time-discrete phase-locked loop according to the invention.

FIG. 2 shows a block diagram of another embodiment of the time-discrete phase-locked loop according to the invention. This embodiment differs from the time-discrete phase-locked loop according to FIG. 1 only in that the discrete time oscillator DTO is adapted to control the increment value INC dependent on the phase error PE. The control unit CU supplies an increment value INC such that the period of the oscillator signal OS fits the repetition frequency of the synchronization instants SI in a stable situation, as known from the prior art. The oscillator signal OS starts again at a fixed start value a fixed period of time after a reference value has been crossed.

Figure 3:
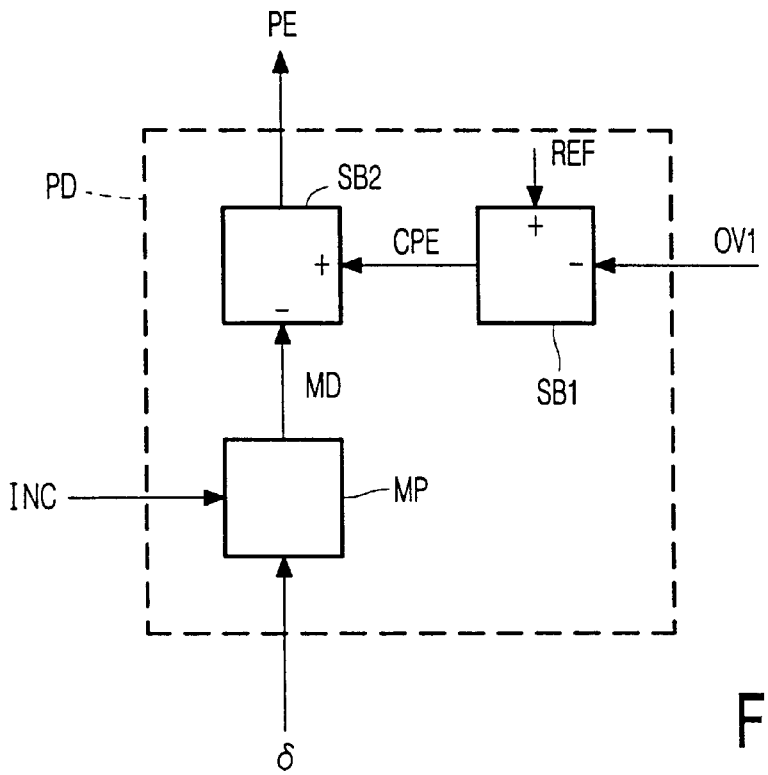
FIG. 3 shows a block diagram of a phase detector for use in the timediscrete phase-locked loop according to the invention.

FIG. 3 shows a block diagram of a phase detector PD for use in the time-discrete phase-locked loop according to the invention. The phase detector PD comprises a first subtracter SB1 a multiplier MP and a second subtracter SB2 The first subtracter SB1 subtracts the sampled value OV1 from a reference value REF to supply a coarse phase error CPE. The coarse phase error CPE is a rough indication of the actual phase error between the synchronization instant SI and the periodical oscillator signal OS, because a value of the oscillator signal OS is used that occurs at a clock instant TC1 which is near the synchronization instant SI only. The multiplier MP multiplies the increment value INC by the fraction $\delta$ to obtain a multiplied difference MD. The fraction $\delta$ is a measure of the position of the synchronization instant SI with respect to the clock signal instants TC of the clock signal CLK. The fraction $\delta$ may express the position of the synchronization instant SI as a percentage of the period of time between two clock instants TC1, TC2. For example, if the clock instant TC1 occurs before the clock instant TC2, $\delta=20\%$ or $\delta=0.2$ indicates that the synchronization instant occurs at the instant TC1+0.2*(TC2-TC1). This is further elucidated with reference to FIG. 5. The second subtracter SB2 subtracts the multiplied difference MD from the coarse phase error CPE to obtain the phase error PE. In conclusion, the phase error PE can be expressed as $$PE = REF - OV1 - \delta * INC$$

In fact, the phase error PE is the difference between the reference value REF and an interpolated value of the oscillator signal OS occurring at the synchronization instant SI. Let it be assumed that the clock instant TC1 precedes the clock instant TC2 and that $\delta=0.2$, then the phase error is $$PE = REF - (OV1 + 0.2 * INC)$$

wherein INC is a positive term. The term between brackets is the interpolated value of the oscillator signal OS at the synchronization instant SI. The phase error PE is independent of the slope of the oscillator signal OS, because the correction on the coarse phase error CPE depends on the slope of the oscillator signal OS. It is possible to define the fraction δ in several other ways.

Figure 4:
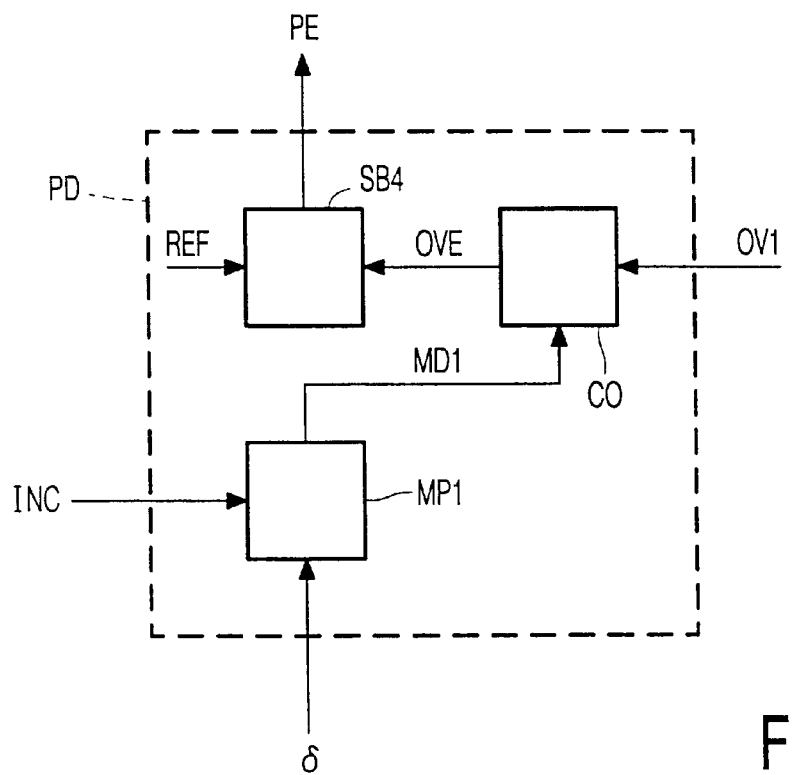
FIG. 4 shows a block diagram of another phase detector for use in the time-discrete phase-locked loop according to the invention.

FIG. 4 shows a block diagram of another phase detector PD for use in the time-discrete phase-locked loop according to the invention. The phase detector PD comprises a subtracter SB4, a correction circuit CO, and a multiplier MP1 The multiplier MP1 multiplies the increment value INC by the fraction δ to obtain a multiplied difference value MD1. If the fraction δ is defined with respect to the sample instant TC1 at which the first oscillator value OV1 occurs, the correction circuit CO adds the multiplied difference value MD1 to the first oscillator value OV1 to obtain an estimated oscillator value OVE at the synchronization instant SI. The subtracter SB4,subtracts the estimated oscillator value OVE from a reference value to obtain the phase error PE.

Figure 5:
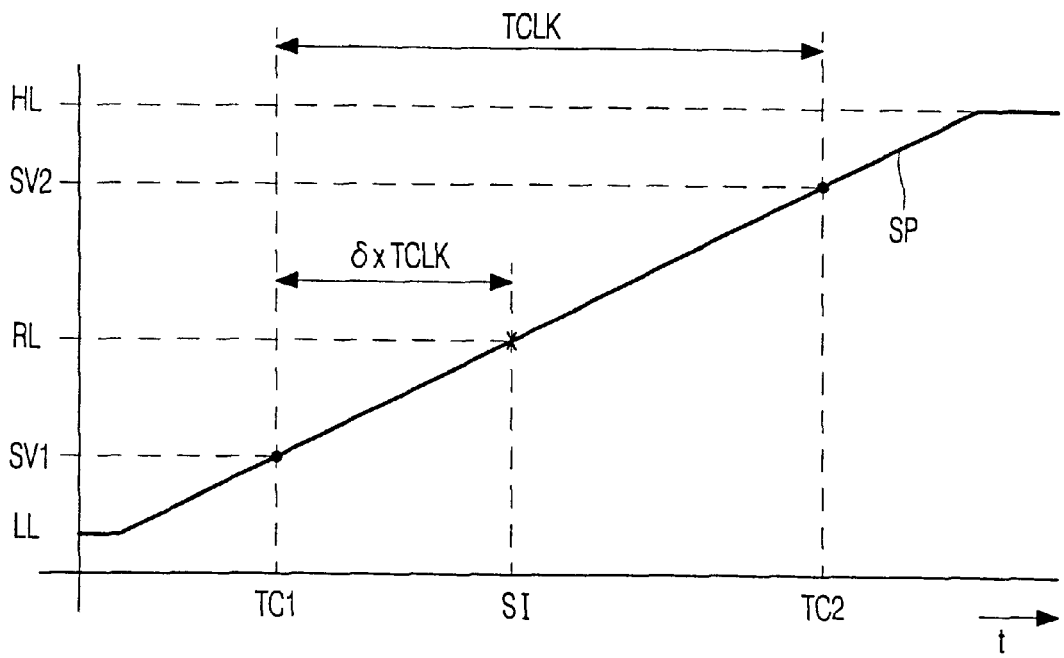
FIG. 5 shows part of a synchronizing pulse to elucidate the determination of the synchronization instant with sub-clock accuracy.

FIG. 5 shows part of a synchronizing pulse SP to elucidate the determination of the synchronization instant SI with sub-clock accuracy. The vertical axis represents synchronization values SV and the horizontal axis represents the time t. Let it be assumed that the synchronization instant SI is the instant at which a rising leading edge of a synchronizing pulse SP crosses a reference level RL. The reference level RL is selected to be the mid-value between the low value LL and the high value HL of the synchronizing pulse SP. A first sampled synchronization value SV1 occurs at a first clock instant TC1, and a second sampled synchronization value SV2 occurs at a second clock instant TC2. The synchronization instant SI occurs within a clock period TCLK between the first and the second clock instant TC1, TC2. The fraction δ is the fraction of the clock period TCLK occurring between the first clock instant TC1 and the synchronization instant SI. Consequently, the fraction δ is calculated as:

$$\delta=(RL-SV1)/(SV2-SV1)$$

Figure 6:
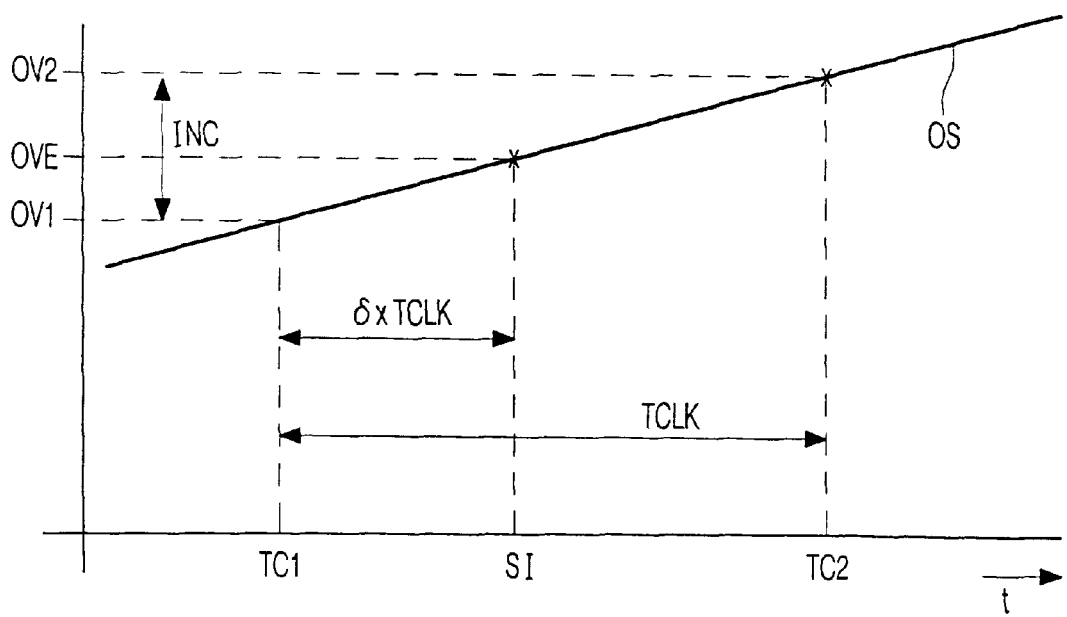
FIG. 6 shows part of the time-discrete time oscillator signal to elucidate the determination of the oscillator value at the synchronization instant with sub-clock accuracy.

FIG. 6 shows part of the time-discrete time oscillator signal OS to elucidate the determination of the oscillator value OVE at the synchronization instant SI with sub-clock accuracy according to an embodiment of the invention. The vertical axis represents oscillator values OV and the horizontal axis represents the time t. Let it be assumed that the oscillator values OV increase with time. A first sampled oscillator value OV1 occurs at the first clock instant TC1, and a second oscillator value OV2 occurs at the second clock instant TC2. The estimated oscillator value OVE at the synchronization instant SI is calculated as:

$$OVE=OV1+\delta*(OV2-OV1).$$

The increment value INC may replace the difference between the first sampled oscillator value OV1 and the second sampled oscillator value OV2.

Figure 7:
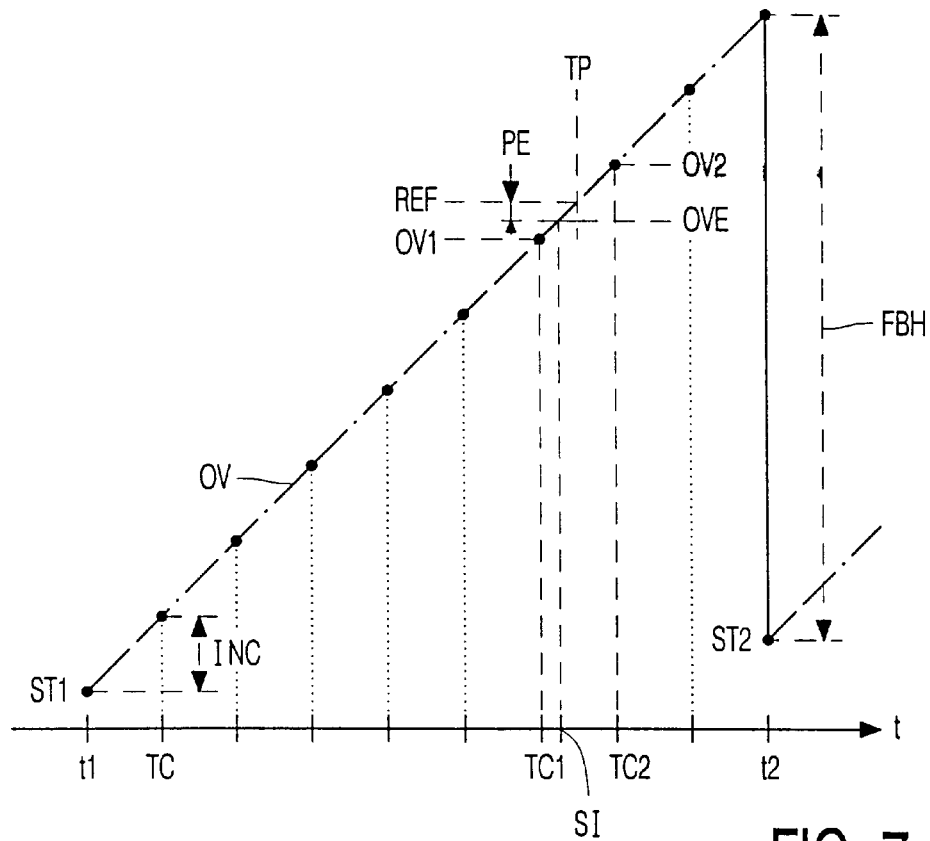
FIG. 7 shows the oscillator signal according to an embodiment of the invention.

FIG. 7 shows the oscillator signal OS according to an embodiment of the invention. The oscillator signal OS is represented as discrete values OV at clock instants TC. A period of the periodical oscillator signal OS starts at t1 with a first value ST1. The next value of the oscillator signal OS is obtained by adding a fixed increment INC to the preceding value of the oscillator signal OS. A subsequent period of the oscillator signal starts at t2 with a pre-set value ST2. The number of clock instants TC in one period of the oscillator signal OS has been kept small for the sake of clarity. Let it be assumed that the synchronization instant SI occurs between the clock instants TC1 and TC2 at which the oscillator signal has the values OV1 and OV2, respectively. A reference level REF crosses a straight line through the oscillator values OV at an instant TP at which the synchronization instant SI is expected to occur. However, in this case, the synchronization instant SI occurs early, and a phase error PE is detected. The phase error PE is, in fact, the difference between the reference value REF and the value OVE of the straight line at the synchronization instant SI. The phase error PE is determined in one of the ways discussed earlier. The flyback height FBH of the oscillator signal OS is calculated on the basis of the phase error PE. In the case shown, the synchronization instant SI occurs early and the flyback height FBH will be decreased, resulting in a pre-set value ST2 with a higher value than the first value ST1. It is also possible to calculate the pre-set value ST2 directly. The flyback height FBH or the starting value ST2 may be calculated in such a way that, in the next period, the phase error PE will be exactly zero. It is also possible to first filter the phase error PE, for example with a PI filter LF as discussed with respect to FIG. 8. After the second value OV2 of the oscillator signal OS has occurred, some time is needed to determine the phase error PE and the flyback height FBH or the starting value ST2, so that it lasts a few clock periods TCLK before a subsequent period of the oscillator signal OS starts.

Let it be assumed that the A/D converter ADC samples the synchronizing pulses SP with a clock frequency of 16 MHz while the DTO is clocked with 48 MHz. Both clocks are supplied by the clock oscillator OSC to prevent interference. Let it further be assumed that the number of synchronizing samples SV occurring during an edge of the synchronization pulses SP (further referred to as valid synchronization samples SV) is at least two but may be more than two. It is also possible that the number (typically 2 to 5) of valid synchronization samples SV varies (typically 1) from edge to edge. The phase error PE is determined with improving accuracy whenever a further valid synchronization sample SV arrives.

When the first valid sample SV from the synchronization edge arrives, one sample value OV is taken from the discrete time oscillator DTO and subtracted from the fixed reference value REF. This gives a coarse value for the phase error PE. For each next valid sample SV from the synchronization edge that may arrive, the discrete time oscillator DTO will increment 3 times the increment value INC. The actual position of the midpoint of the synchronization edge lies halfway the valid samples SV. To compensate for the fact that the discrete time oscillator DTO keeps on incrementing, the sampled phase error must be decremented by 1.5 times the increment value INC at a rate of 16 Ms/s for every extra synchronization edge sample SV that is taken. Alternatively, it will be decremented 3 times by 0.5 times the increment value INC, at a rate of 48 Ms/s for every extra synchronization edge sample SV at 16 Ms/s.

When the last valid sample from the synchronization edge SV has arrived (the next one will have an invalid value), it is time to start an interpolation. The result of the interpolation gives a final correction of the phase error PE, based on the estimated position SI of the input synchronization edge within one sample interval. This correction is typically between−1.5 and+1.5 times the increment value INC.

Due to processing latency, the phase error result PE is available some (many) clock pulses CLK after the center of the synchronization edge has occurred. This has little or no effect on the phase-locked loop performance, because the resulting flyback height FBH is a relative correction. It does not really matter if it is executed at an earlier or later instant.

As an improvement, the whole process can be doubled for detecting on two input synchronization edges. This allows the phase-locked loop to follow the (weighted) average position between the rising and falling edge of the synchronizing pulses SP. This may be particularly useful if the synchronizing pulses SP happen to be derived from the horizontal flyback pulse, because the horizontal flyback pulse suffers from width variations due to beam current loading.

In order to process two synchronization edges, the whole phase detector circuit PD is simply duplicated. At the far input, one signal from the A/D converter is inverted in order to make this phase detector PD react to the other synchronization slope. After both phase errors have been determined, a PI-regulator may calculate the new flyback height value FBH based on a weighted phase error. After that, the flyback is performed and a new line begins.

Again, it is not necessary to actually sample the oscillator value OV2 to determine the slope of the oscillator signal OS by calculating the difference between the oscillator values OV1 and OV2. The slope of the oscillator signal OS is determined by the increment value INC.

Figure 8:
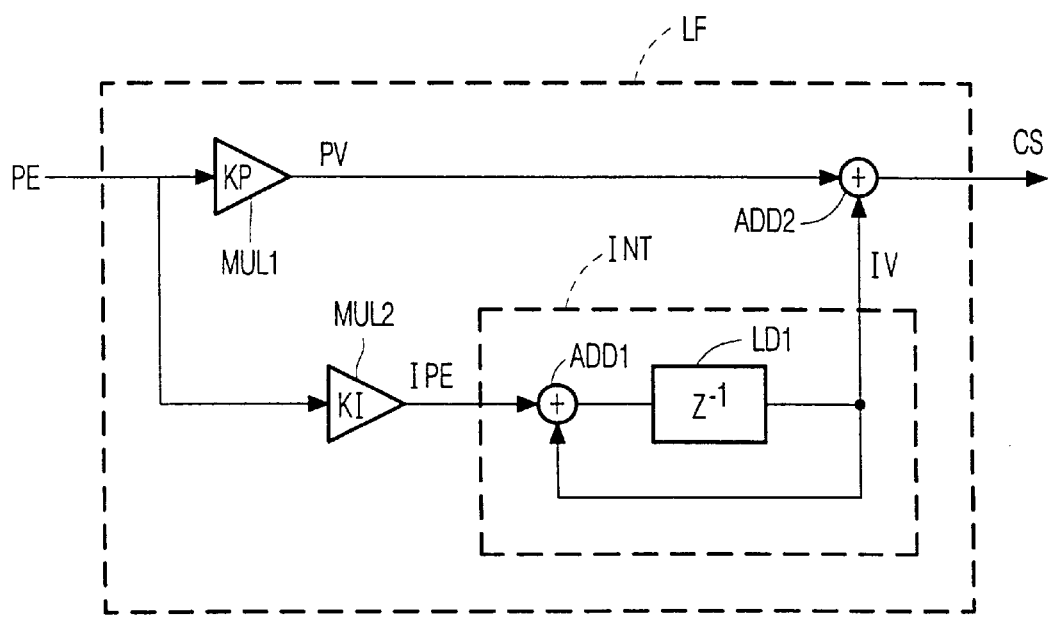
FIG. 8 shows an embodiment of the loop filter according to the invention.

FIG. 8 shows an embodiment of the loop filter LF according to the invention. In order to obtain a zero phase error PE independent of the line frequency, the phase-locked loop should be controlled by a PI regulator which comprises a proportional path comprising a multiplier MUL1 supplying a proportional value PV, an integrating path IP supplying an integrating value IV, and an adder ADD2 adding the proportional value PV and the integrating value IV to supply the control signal CS. In a stationary state, the control signal CS is supplied by the integrating path IP. The proportional part MUL1 serves to improve the dynamic behavior of the phase-locked loop.

The multiplier MUL1 multiplies the phase error PE by a first constant KP to obtain the proportional value PV. A multiplier MUL2 multiplies the phase error PE by a second constant KI to obtain a multiplied phase error IPE which is integrated by an integrator INT. The integrator INT supplies the integrating value IV. The integrator INT comprises an adder ADD1 adding the integrating value IV to the multiplied phase error IPE to supply an addition value to a line delay LD. The line delay LD supplies the. integrating value IV.

While the invention has been described in connection with preferred embodiments, it will be understood that modifications thereof within the principles outlined above will be evident to those skilled in the art and thus the invention is not limited to the preferred embodiments but is intended to encompass such modifications.

The embodiments of the invention are elucidated by using two succeeding sample instants TC1, TC2 occurring during an edge of a synchronizing pulse SP. If more than two clock instants occur during an edge of a synchronizing pulse SP, it is also possible to use two sample instants TC which are spaced apart by more than one clock period. The fraction δ determines the position of the synchronization instant SI within the time interval between the two sample instants TC. It is further possible to use more than two synchronization sample instants TC to interpolate the synchronization instant SI. If the increment value INC of the oscillator signal OS is determined by selecting two oscillator sample instants TC to sample the oscillator signal OS, the actual value of the oscillator signal OS at the synchronization instant SI is still obtained by multiplying the difference of the two oscillator values OV1, OV2 occurring at the two oscillator sample instants TC, respectively, by the fraction δ.

While the embodiments of the invention have been elucidated with reference to hardware circuits, it is also possible to perform the majority of operations with a suitable programmed computer.

In brief, an important aspect of the invention provides a time-discrete phase-locked loop which comprises a discrete time oscillator DTO supplying a periodical oscillator signal OS representing oscillator values OV at corresponding clock instants TC of a clock signal CLK. A position-determining circuit P generates a time-discrete synchronization instant SI representing a position of an analog synchronizing pulse SP of a video signal with sub-clock period accuracy. A phase detector PD determines a phase error PE between the discrete time oscillator signal OS and the synchronization instant SI by using the synchronization instant SI, a value OV1 of the discrete time oscillator signal OS at a clock instant TC1 related to the synchronization instant SI, and the slope of the oscillator signal OS. A period of the oscillator signal OS depends on the phase error PE. By using the slope of the oscillator signal OS, the phase error PE is independent of this slope.

We claim:

1. A time-discrete phase-locked loop for generating a periodical oscillator signal locked to synchronizing pulses in a video signal, said time-discrete phase-locked loop comprising:

a clock oscillator for determining clock instants;

position-determining means coupled to receive said synchronizing pulses for supplying time-discrete synchronization instants with sub-clock accuracy;

a discrete time oscillator comprising an integrator for summing an increment value at the clock instants, and for supplying the oscillator signal having a period which is dependent on a phase error between said synchronization instants (SI) and said oscillator signal;

a sampler for sampling said oscillator signal at a specific clock instant which is related to said synchronization instant to form a sampling value; and a phase detector for estimating the phase error dependent on the sampling value and said synchronization instant, characterized in that the phase detector further estimates the phase error dependent on said increment value.

2. A time-discrete phase-locked loop as claimed in claim 1, characterized in that the position-determining means comprises a calculation unit for calculating a synchronization instant as a fraction of a time period between two clock instants, and the phase detector calculates the phase error as

PE=REF−(OV1+δ*INC), wherein REF is a reference value, OV1 is the sampling value, δ is the fraction of the time period, and INC is the increment value.

3. A time-discrete phase-locked loop as claimed in claim 1, characterized in that the discrete time oscillator further comprises a control unit for adapting the increment value in response to the phase error for controlling said period of the oscillator signal.

4. A time-discrete phase-locked loop as claimed in claim 1, characterized in that the discrete time oscillator further comprises a control unit for adapting a flyback height of the discrete time oscillator in response to the phase error for controlling said period of the oscillator signal.

5. A time-discrete phase-locked loop as claimed in claim 1, characterized in that said time-discrete phase-locked loop further comprises:

an A/D converter for converting said analog synchronizing pulses to a time-discrete synchronizing signal; and a timing control unit coupled to receive the time-discrete synchronizing signal for detecting a first sample of an active synchronizing pulse, said specific clock instant coinciding with the occurrence of said first sample.

6. A method of locking a periodical oscillator signal of a discrete time oscillator to periodical synchronization pulses in a video signal, the method comprising the steps:

generating clock instants;

determining time-discrete synchronization instants representing instants of occurrence of said synchronizing pulses with sub-clock period accuracy;

integrating an increment value at the clock instants for supplying said oscillator signal having a period which is dependent on a phase error between said synchronization instants and said oscillator signal;

sampling said oscillator signal at a clock instant which is related to one of the synchronization instants to form a sampling value; and estimating the phase error dependent on the sampling value and said one of the synchronization instants, characterized in that the estimating further comprises estimating the phase error dependent on said increment value.

7. A method of locking the periodical oscillator signal to the synchronization instants as claimed in claim 6, characterized in that the determining step comprises calculating the synchronization instants as a fraction of a time period between two clock instants, and the step of estimating the phase error comprises:

determining a difference between the sampling value and a reference value to form a coarse phase error;

multiplying the increment value by the fraction of the time period to form a multiplied difference; and correcting the coarse phase error with the multiplied difference to form the phase error.

8. A method of locking the periodical oscillator signal to synchronization instants as claimed in claim 6, characterized in that the determining step comprises calculating the synchronization instants as a fraction of a time period between two clock instants, and the step of estimating the phase error comprises:

multiplying the increment value by the fraction of the time period to form a multiplied difference;

correcting the sampling value with said multiplied difference to form an estimated oscillator value at the synchronization instant; and determining a difference between the estimated oscillator value and a reference value to form the phase error.

9. A display apparatus comprising a time discrete phase locked loop for generating a periodical oscillator signal being locked to synchronizing pulses in a video signal and comprising:

a clock oscillator for determining clock instants;

position-determining means coupled to receive said synchronizing pulses for supplying time-discrete synchronization instants with sub-clock accuracy;

a discrete time oscillator comprising an integrator for summing an increment value (INC) at the clock instants for supplying the oscillator signal having a period which is dependent on a phase error between said synchronization instants and said oscillator signal;

a sampler for sampling said oscillator signal at a clock instant which is related to said synchronization instant to form a sampling value; and a phase detector for estimating the phase error dependent on the sampling value and said synchronization instant, characterized in that the phase detector further estimates the phase error dependent on said increment value.

* * * * *